(12) United States Patent
Lam

(10) Patent No.: US 8,039,849 B2
(45) Date of Patent: Oct. 18, 2011

(54) LED MODULE

(75) Inventor: Chu-Fong Lam, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 809 days.

(21) Appl. No.: 11/284,825

(22) Filed: Nov. 23, 2005

(65) Prior Publication Data

US 2007/0114558 A1 May 24, 2007

(51) Int. Cl.
*H01L 33/60* (2010.01)
(52) U.S. Cl. .............. 257/88; 257/98; 257/E33.057; 257/E33.072
(58) Field of Classification Search ............ 257/88, 257/E33.056, E33.057, E33.072, 79, 98, 257/99, E33.055, E33.058, E33.059, E33.067, 257/E33.068, E33.069, E33.07, E33.071, 257/E33.073, E33.074
See application file for complete search history.

(56) References Cited

U.S. PATENT DOCUMENTS

| 5,001,609 | A  | * | 3/1991  | Gardner et al. | 362/555 |
| 5,534,718 | A  | * | 7/1996  | Chang | 257/98 |
| 6,593,598 | B2 | * | 7/2003  | Ishinaga | 257/98 |
| 6,642,547 | B2 | * | 11/2003 | Matsubara et al. | 257/98 |
| 6,680,491 | B2 | * | 1/2004  | Nakanishi et al. | 257/98 |
| 6,774,405 | B2 | * | 8/2004  | Yasukawa et al. | 257/99 |
| 7,019,334 | B2 | * | 3/2006  | Yatsuda et al. | 257/98 |

* cited by examiner

*Primary Examiner* — Samuel Gebremariam
*Assistant Examiner* — Andrew O. Arena
(74) *Attorney, Agent, or Firm* — Jackson IPG PLLC; Demian K. Jackson

(57) ABSTRACT

An LED module to realize light source performance as desire is comprised of multiple LEDs, a light-emitting chip of each LED being disposed in a carrier on a substrate; conduction circuits with different polarities being provided perimeter to the carrier on the substrate; golden plate wire connecting the chip and circuits; carrier being filled with fluorescent material before encapsulation; a slope being formed on the inner wall of the carrier; and the light-emitting angles varying depending on inclination carrier or the encapsulating height.

5 Claims, 8 Drawing Sheets

LED MODULE

BACKGROUND OF THE INVENTION (a) Field of the Invention

The present invention is related to a construction of LED module, and more particularly, to one that realizes the expected light source through arrangement of multiple LEDs each at different light emitting angle.

(b) Description of the Prior Art

LED for providing features including compact in size, low power consumption, low temperature and long service life has been gradually replacing the conventional tungsten filament bulb. The basic construction of an LED involves having provided in a see-through packaging a carrier and multiple conduction terminals of different electrodes; a chip is set in the carrier, the electrode layer and those conduction terminals are connected by means of a golden plate wire; and each conduction terminal extends out of the see-through packaging to serve connection to the source.

With those conduction terminals are conducted, the light source generated by the chip emits the light. Fluorescent material is disposed to the peripheral of the chip so that once the light from the chip passes through the fluorescent material its wave length is incorporated with that of the fluorescent material to emit the light in an expected color. An LED may be assigned with a specific light color presentation using selected fluorescent materials thanks to improved process and technology to further fast expand the marketplace of the LED.

SUMMARY OF THE INVENTION

The primary purpose of the present invention is to provide an LED module that realizes expected performance of light source and is applicable to general lighting fixtures, e.g., table lamp or other wall-mounting lamps by arranging multiple LEDs at different light emitting angles.

To achieve the purpose, the LED module of the present invention is comprised of multiple LEDs with a light-emitting chip of each LED mounted in its respective pit carrier disposed on a substrate. A slope is formed on the inner wall of the carrier, and the light-emitting angle varies depending on the angle of the inclination.

Another purpose of the present invention is to provide an LED module that the lighting-emitting angle for each light-emitting chip is different depending on the curvature of a packaging adhesive. To achieve the purpose, the LED module of the present invention is comprised of multiple LEDs with a light-emitting chip of each LED mounted in its respective pit carrier disposed on a substrate. Conduction circuits of different polarities are disposed on the substrate to the perimeter of the carrier; the layer of electrodes of the light-emitting chip and conduction circuits are connected using golden plated wire; the carrier is filled with fluorescent material; and the fluorescent material is then encapsulated at a curvature that is different from others.

DETAILED DESCRIPTION OF THE PREFERRED EMBODIMENTS

Figure 1:
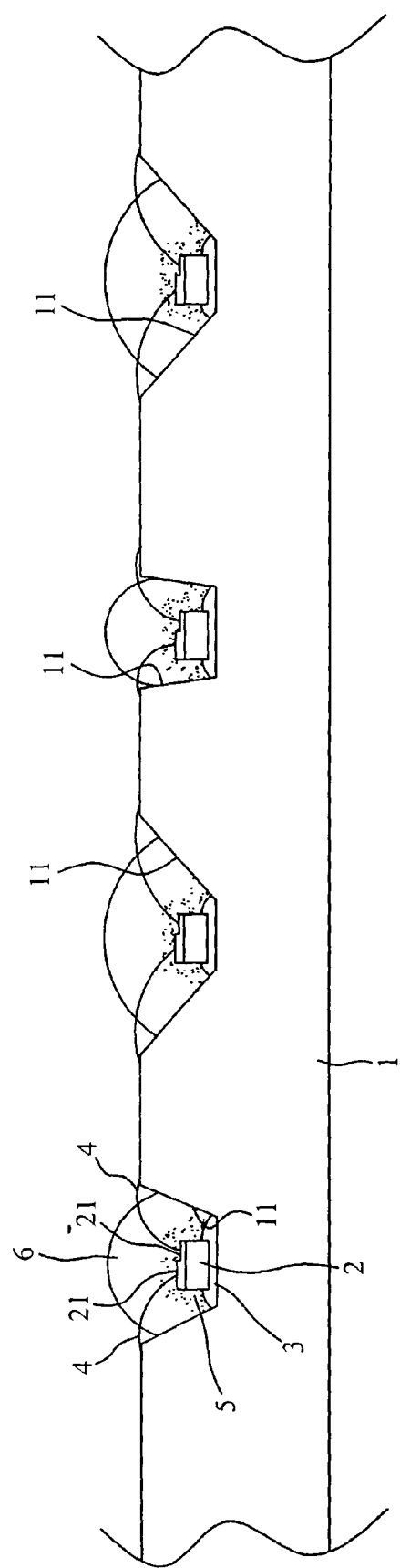
FIG. 1 is a schematic view showing a construction of a first preferred embodiment of the present invention.

Referring to FIG. 1, an LED module is comprised of multiple LEDs. Each LED contains a substrate 1 provided with multiple pit carriers 11. Conduction circuits (not illustrated) of different polarities are provided on the substrate 1 to the perimeter of the carrier 11. A light-emitting chip 2 is mounted to the carrier 11 with chip binding adhesive 3. A golden plate wire 4 connects an electrode layer 21 of the light-emitting chip 2 and those conduction circuits. The carrier 11 is filled with a fluorescent powder layer 5 before being packaged with an encapsulating material 6. With conduction circuits 12 are conducted, the wavelength of those rays of light emitted from the chip 2 are passing through and incorporated into a visible light with that of the fluorescent powder layer 5. If a pseudo-white light is expected, a blue light-emitting chip is used to excite yellow fluorescent powder mixed in the fluorescent powder layer 5. If RGB mixing results to produce a light color approximating white light color with comparatively higher color development properties are expected, red and green fluorescent powders are added into the fluorescent powder layer 5.

Figure 2:
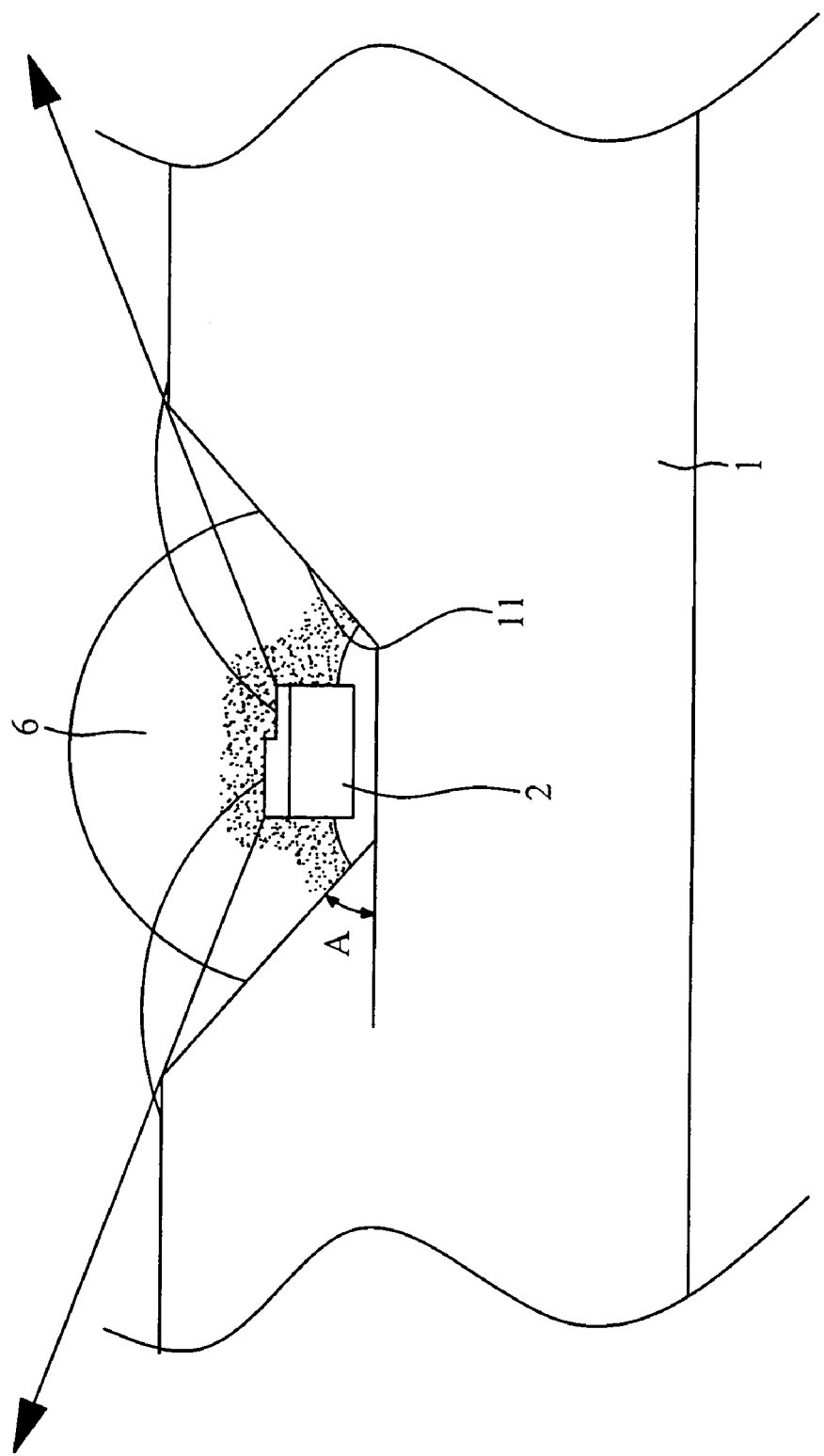
FIG. 2 is a schematic view showing a slope of at a smaller angle is formed on the inner wall of a carrier in the first preferred embodiment of the present invention.
Figure 3:
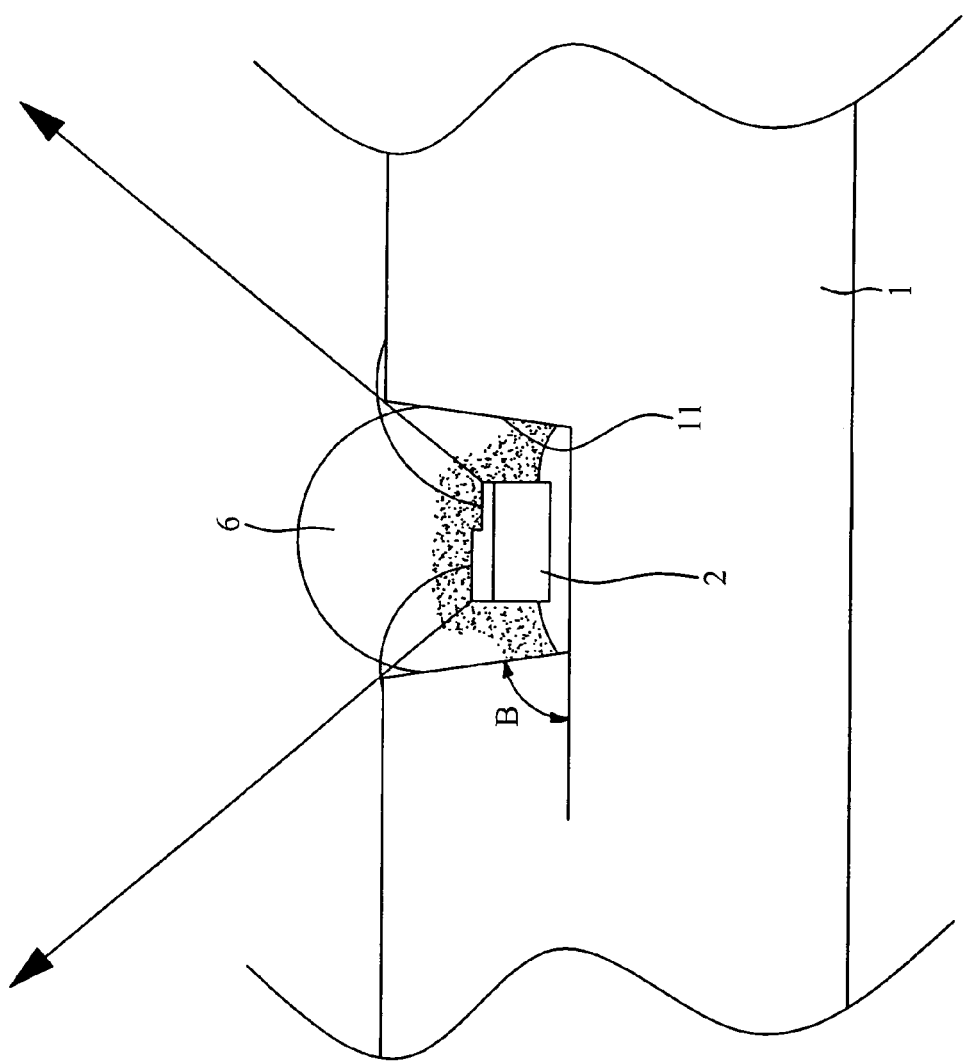
FIG. 3 is a schematic view showing a slope of at a greater angle is formed on the inner wall of a carrier in the first preferred embodiment of the present invention.

A slope at a given angle is formed on the inner wall of each carrier 11 as illustrated in FIGS. 2 and 3 respectively designated as Angle A and Angle B with A<B, resulting in rays of light are emitted at different angles from the chip 2. The smaller the angle of the slope on the carrier 11, the greater the light-emitting angle as illustrated in FIG. 2; on the contrary, the larger the angle of the slope on the carrier 11, the smaller the light-emitting angle as illustrated in FIG. 3. Multiple carriers 11 at different slope angles are disposed on the substrate 1. As illustrated in FIG. 1, a first preferred embodiment of the present invention has each carrier 11 provided with multiple different angles of slope for its chip to emit rays of light at different angles for realizing the well mixed light with expected performance of a light source.

Figure 4:
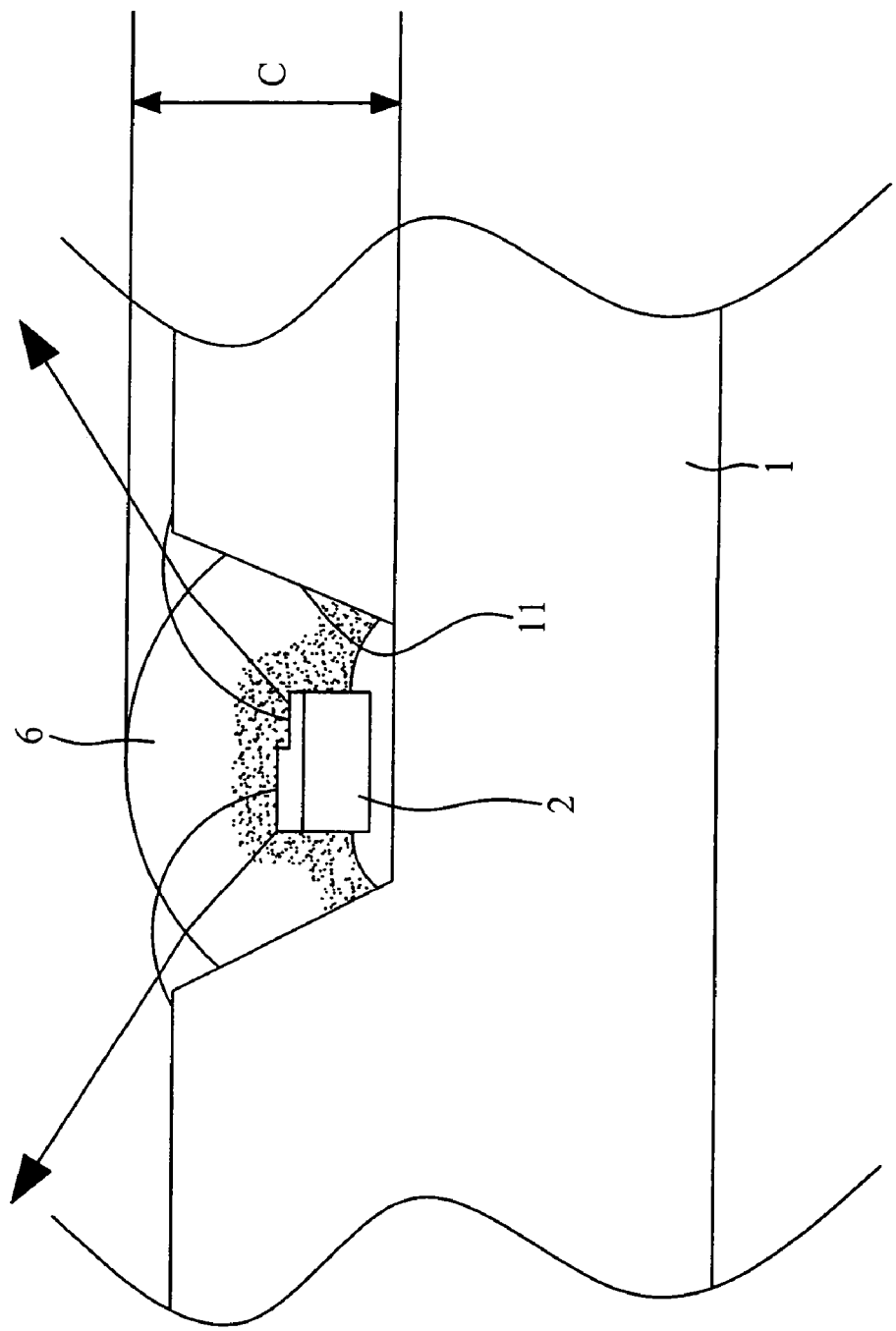
FIG. 4 is a schematic view showing a construction of the first preferred embodiment of the prevent invention provided with a lower encapsulation.
Figure 5:
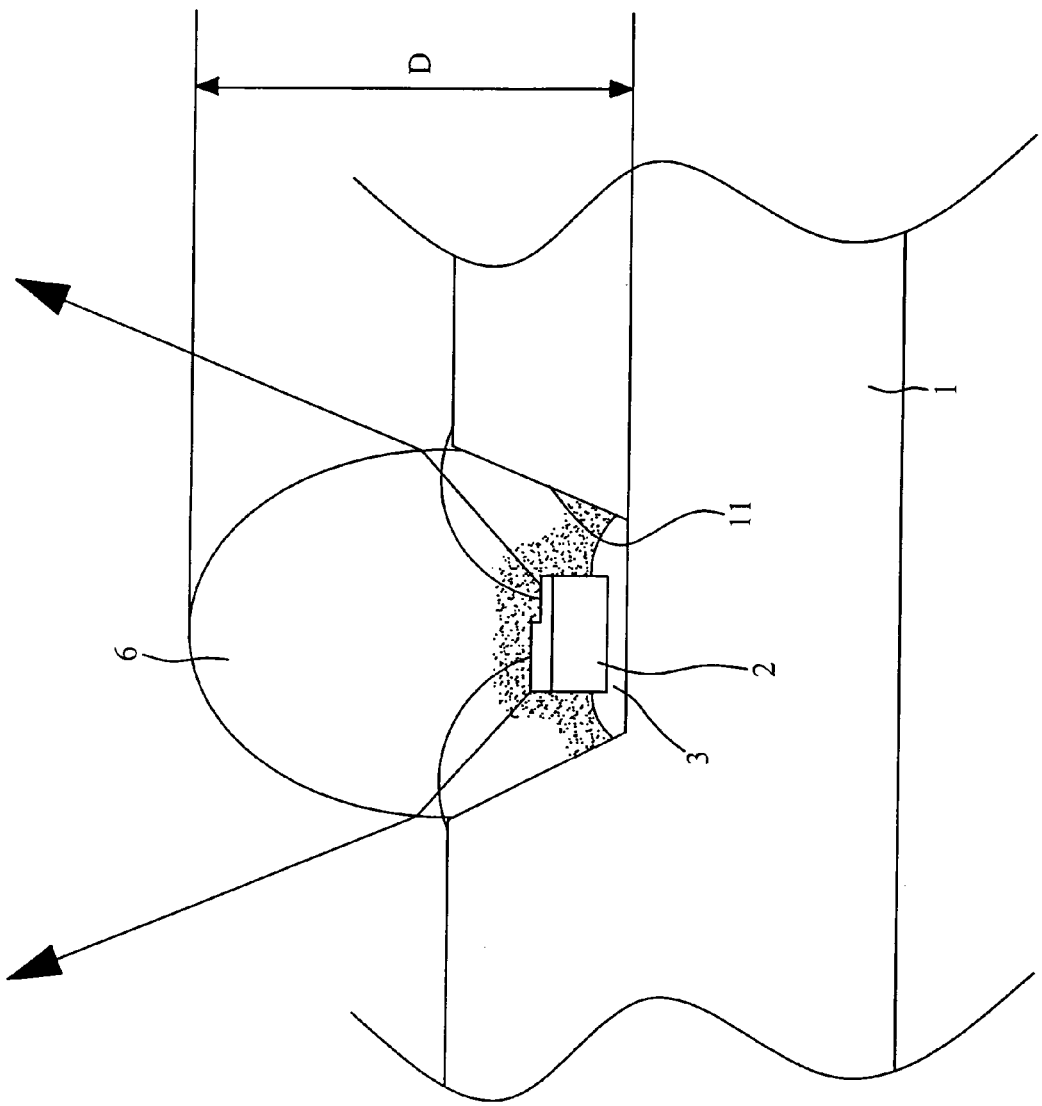
FIG. 5 is a schematic view showing a construction of the first preferred embodiment of the present invention provided with a higher encapsulation.
Figure 6:
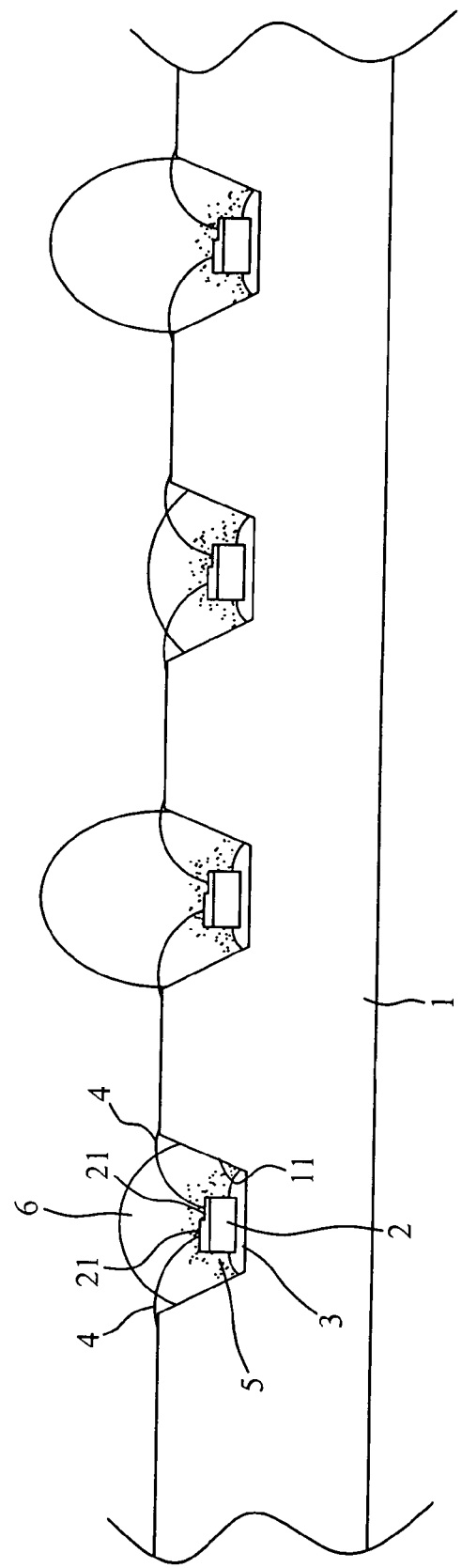
FIG. 6 is a schematic view showing a construction of a second preferred embodiment of the present invention.

Alternatively, the height of the encapsulating material 6 may vary to achieve the same purpose of causing different light-emitting angles as illustrated in FIGS. 4 and 5 respectively designated by Height C and Height D with C<D. As a result, rays of light emitted from the chip 2 also vary in that the lower the encapsulating material 6, the greater the light-emitting angle as illustrated in FIG. 4; on the contrary, the higher the encapsulating material 6 the smaller the light-emitting angle. Multiple encapsulating materials 6 are disposed on the substrate 1. As illustrated in FIG. 6, rays of light emitted at different angles from those chips are mixed to achieve the expected performance of a light source. The reflection layer (not illustrated) in the carrier is provided with high reflectivity to enforce the light source performance. The same purpose can be also achieved by combing multiple encapsulating materials 6 and each carrier 11 is provided with different angles of slopes on the inner wall.

Figure 7:
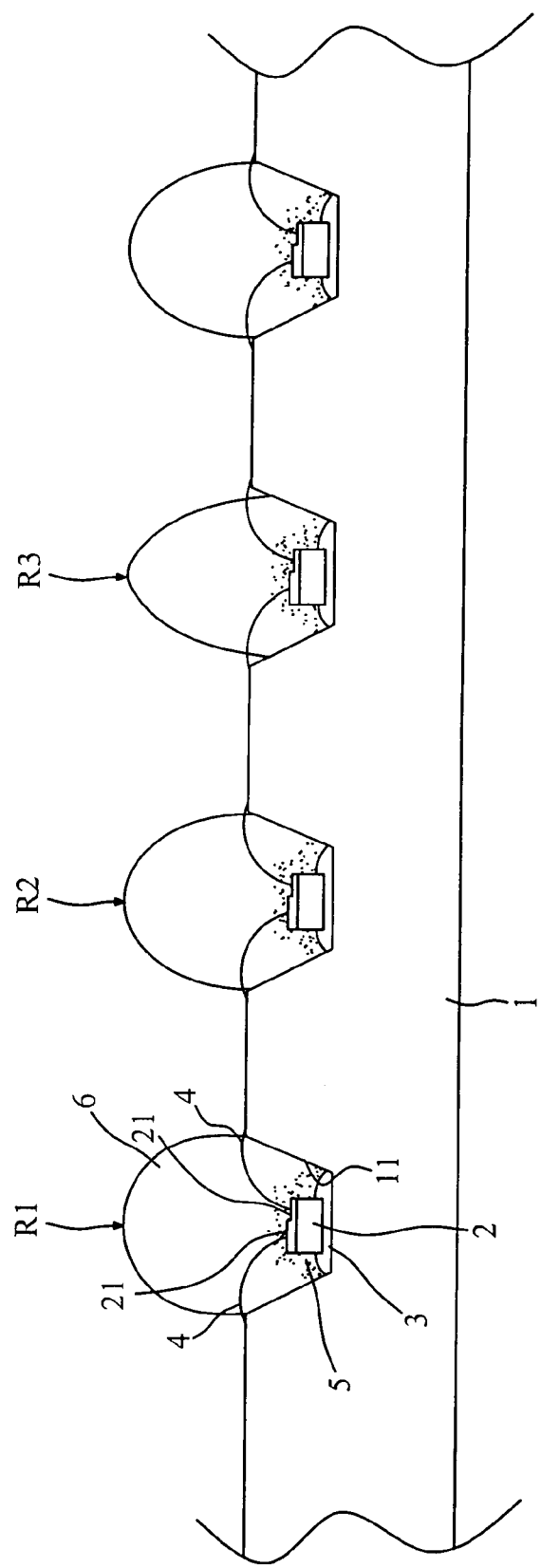
FIG. 7 is a schematic view showing a construction of a third preferred embodiment of the present invention.

Furthermore, the same purpose of having different light-emitting angles can be also realized by having all the encapsulating materials packaged at the same height, but assigned with different curvatures. As illustrated in FIG. 7, multiple curvatures of the encapsulating material are provided with different curvatures of R1, R2, and R3 and R1>R2>R3 to enable rays of light form chips are emitted at different angles to mix the light to achieve the expected performance of the light source. Wherein, those encapsulating materials 6 may be made at different heights, or inner wall of the carrier provided with different angles of slope to achieve the same light mixing results. Again, the reflection layer in the carrier is provided with high reflectivity to enforce the light source performance.

Figure 8:
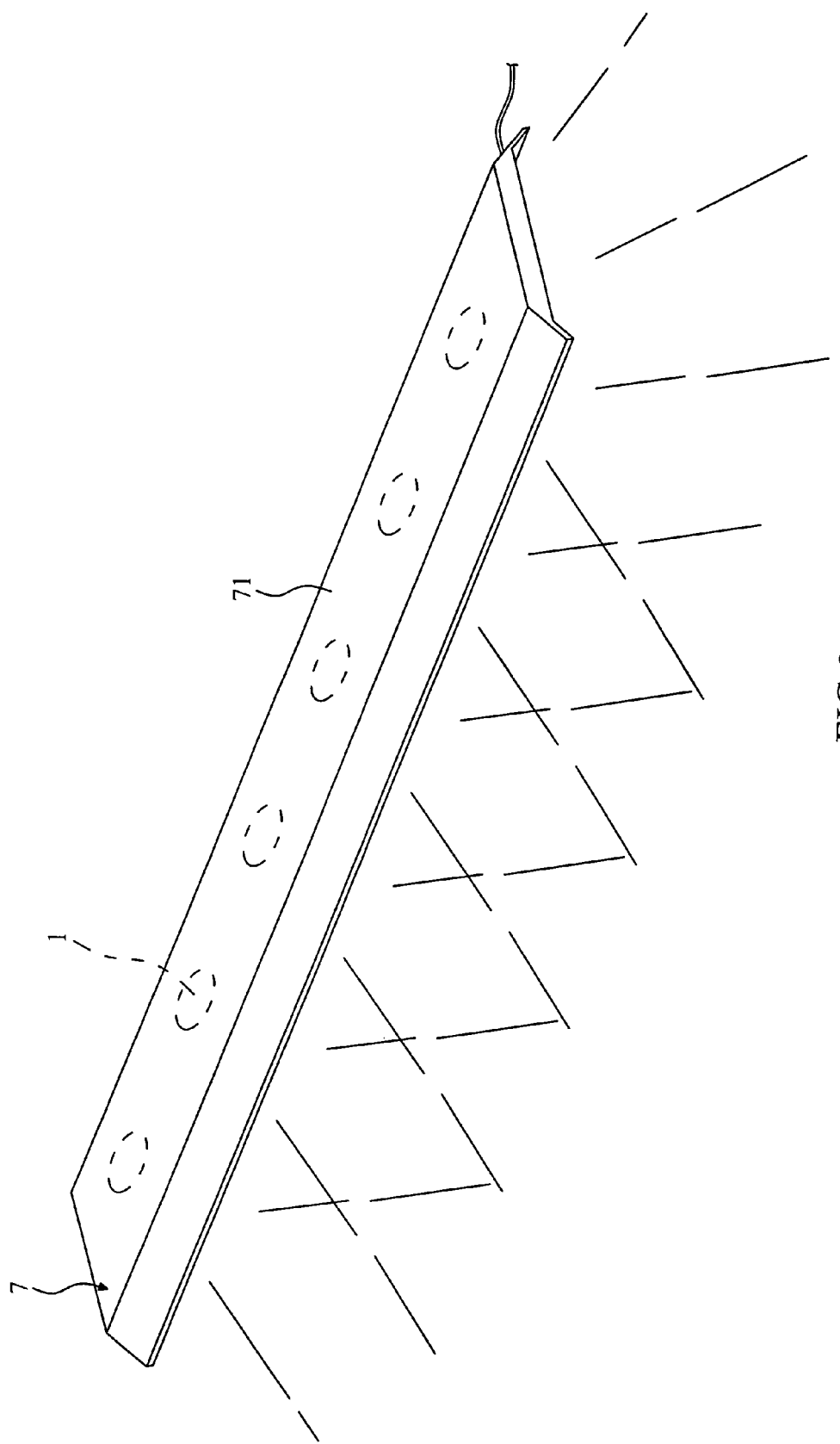
FIG. 8 is a schematic view showing a construction of the present invention applied in a lighting fixture.

The LED module of the present invention may be mounted to a general lighting fixture 7 (e.g., a table light or other wall-mounting lighting fixtures) to provide the lighting source. As illustrated in FIG. 8, the LED module is fixed to a holder 71 to achieve the purpose of mixing light for expected performance of the light source by having the carriers disposed on their inner wall multiple slopes at different angles; and/or the encapsulating materials disposed at different height or provided with different curvatures for the chip to emit rays of light at different angles.

The prevent invention provides an improved construction of an LED module, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. An LED module comprised of a holder having multiple LEDs, a substrate of the holder having multiple it carriers formed therein, each light-emitting chip being mounted in the respective pit carrier formed in the substrate of the holder; a slope is formed on the inner wall of each carrier; and the light-emitting angles varies depending on the slope,
wherein the it carriers comprise a first it carrier formed in the substrate adjacent a second it carrier formed in the substrate, the first it carrier having a first slope profile, the second it carrier having a second slope profile, the first slope profile differing from the second slope profile.

2. The LED module comprised of claim 1, wherein multiple conduction circuits with different polarities are provided perimeter to the carrier on the substrate; golden plate wire connects the chip and circuits; and the carrier is filled with fluorescent material before encapsulation.

3. The LED module comprised of claim 1, wherein each carrier extends for multiple inclinations.

4. The LED module of claim 1, wherein a reflection layer with high reflectivity is provided in the carrier.

5. The LED module of claim 1, wherein the pit carriers further comprise, in order and adjacent to one another, the first pit carrier having the first slope profile, the second pit carrier having the second slope profile, and a third pit carrier having a third slope profile,
wherein the respective slope profiles of each of the first pit carrier, the second pit carrier, and the third pit carrier are all different relative to one another.

* * * * *